(12) United States Patent
Wu

(10) Patent No.: US 11,658,429 B1
(45) Date of Patent: May 23, 2023

(54) BUS DEVICE OF TERMINAL BLOCK

(71) Applicants: DINKLE ENTERPRISE CO., LTD., New Taipei (TW); DINKLE ELECTRIC MACHINERY (CHINA) CO., LTD., Jiangsu (CN)

(72) Inventor: Shang-Tsai Wu, New Taipei (TW)

(73) Assignees: DINKLE ENTERPRISE CO., LTD., New Taipei (TW); DINKLE ELECTRIC MACHINERY (CHINA) CO., LTD., Jiangsu (CN)

( * ) Notice: Subject to any disclaimer, the term of this patent is extended or adjusted under 35 U.S.C. 154(b) by 0 days.

(21) Appl. No.: 17/690,572

(22) Filed: Mar. 9, 2022

(51) Int. Cl.
*H01R 9/24* (2006.01)
*H01R 9/26* (2006.01)
*H01R 25/14* (2006.01)

(52) U.S. Cl.
CPC ......... *H01R 9/2416* (2013.01); *H01R 9/2491* (2013.01); *H01R 9/2608* (2013.01); *H01R 25/14* (2013.01)

(58) Field of Classification Search
CPC .. H01R 9/2416; H01R 9/2491; H01R 9/2608; H01R 25/14; H01R 13/639
See application file for complete search history.

(56) References Cited

U.S. PATENT DOCUMENTS 9,197,017 B2 * 11/2015 Wu .................. H01R 13/62966
10,355,411 B2 * 7/2019 Wu ..................... H01R 13/6273

* cited by examiner

*Primary Examiner* — Oscar C Jimenez
*Assistant Examiner* — Paul D Baillargeon
(74) *Attorney, Agent, or Firm* — Chun-Ming Shih; HDLS IPR Services

(57) ABSTRACT

A bus device of a terminal block includes a case and a latch assembly. The case has a connecting side and is formed with a sliding trough. The latch assembly includes an actuator and a locking peg. The actuator is disposed in the sliding trough and movable along the sliding trough between a release position and a locking position. The actuator has an actuating ramp set. The locking peg is axial-rotatably disposed in the case and arranged corresponding to an end of the sliding trough. An end of the locking peg projects from the connecting side and has an inverted hook. The locking peg has a protrusive key abutting against the actuating ramp set. When the actuator moves between the release position and the locking position, the actuating ramp set is configured to push the protrusive key to axially rotate the locking peg.

11 Claims, 9 Drawing Sheets

BUS DEVICE OF TERMINAL BLOCK

BACKGROUND

Technical Field

The disclosure relates to a terminal block, particularly to a bus device of a terminal block, which is easy to be assembled or disassembled.

Related Art

In the related art, a bus of a terminal block is disposed on a case and the case is inserted to a socket. The case has a fastener for locking the socket. A simplified fastener may be, for example, a flexible arm hook. Such a flexible arm hook is simple and easy to be assembled, but it only can be positioned at a locking position and cannot be positioned at a releasing position. The socket is released only by removing the case from the case with simultaneously pressing the flexible arm hook. Thus, that is inconvenient in operation. Also, a flexible arm hook, which is easy to be released, is hard to be firmly connected. A flexible arm hook which can be firmly connected is usually laborious when pressing to release.

In view of this, the inventors have devoted themselves to the above-mentioned related art, researched intensively and cooperated with the application of science to try to solve the above-mentioned problems. Finally, the invention which is reasonable and effective to overcome the above drawbacks is provided.

SUMMARY

The disclosure provides a bus device of a terminal block, which is easy to be assembled or disassembled.

The disclosure provides a bus device of a terminal block, which includes a case and a latch assembly. The case has a connecting side and is formed with a sliding trough. The latch assembly includes an actuator and a locking peg. The actuator is disposed in the sliding trough and movable along the sliding trough between a release position and a locking position. The actuator has an actuating ramp set. The locking peg is axial-rotatably disposed in the case and arranged corresponding to an end of the sliding trough. An end of the locking peg projects from the connecting side and has an inverted hook. The locking peg has a protrusive key abutting against the actuating ramp set. When the actuator moves between the release position and the locking position, the actuating ramp set is configured to push the protrusive key to axially rotate the locking peg.

In the bus device of the terminal block of the disclosure, the actuator has a stem projecting from the case.

The bus device of the terminal block of the disclosure further includes an elastic member disposed in the case and abutting against the case to push the inverted hook toward the case.

In the bus device of the terminal block of the disclosure, the case is provided with a positioning structure, the positioning structure includes a pair of engaging slots, the engaging structure is an engaging hook, and the engaging structure is engaged with one of the engaging slots correspondingly when the actuator moves to the release position or the locking position.

In the bus device of the terminal block of the disclosure, the case includes a box portion and a cover closing the box portion, the sliding trough is formed in the box portion, and the latch assembly is received in the box portion.

In the bus device of the terminal block of the disclosure, the actuating ramp set includes a release ramp and a locking ramp facing to each other, and the protrusive key is arranged between the release ramp and the locking ramp. Each of the release ramp and the locking ramp is a spiral ramp. The release ramp is disposed away from the inverted hook. The locking ramp is disposed toward the inverted hook.

The bus device of the terminal block of the disclosure further includes a socket. The bottom of the socket is formed with a locking hole. The case is connected to the socket with the connecting side. The inverted hook passes the locking hole when the actuator is located at the release position. The inverted hook is hooked to an internal surface of the locking hole when the actuator is located at the locking position.

The bus device of the terminal block of the disclosure uses the actuating ramp set to push the protrusive key to make the locking peg axially rotate to drive the inverted hook to hook the locking hole to lock the case onto the socket or make the locking peg reversely rotate to release the socket. The engaging connection is firm and easy to be released.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
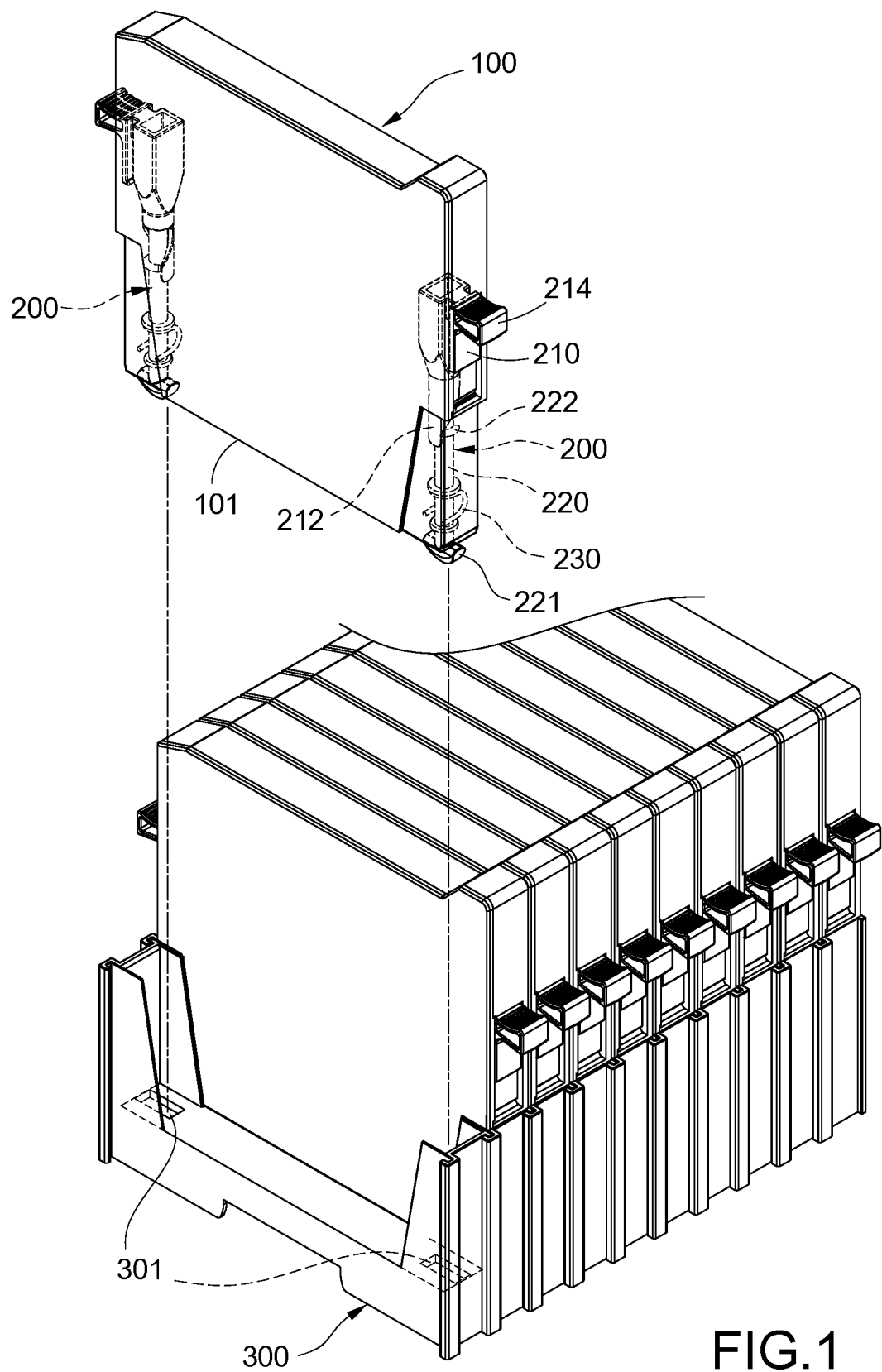
FIG. 1 is a perspective schematic view of the bus device of the terminal block of the disclosure.
Figure 2:
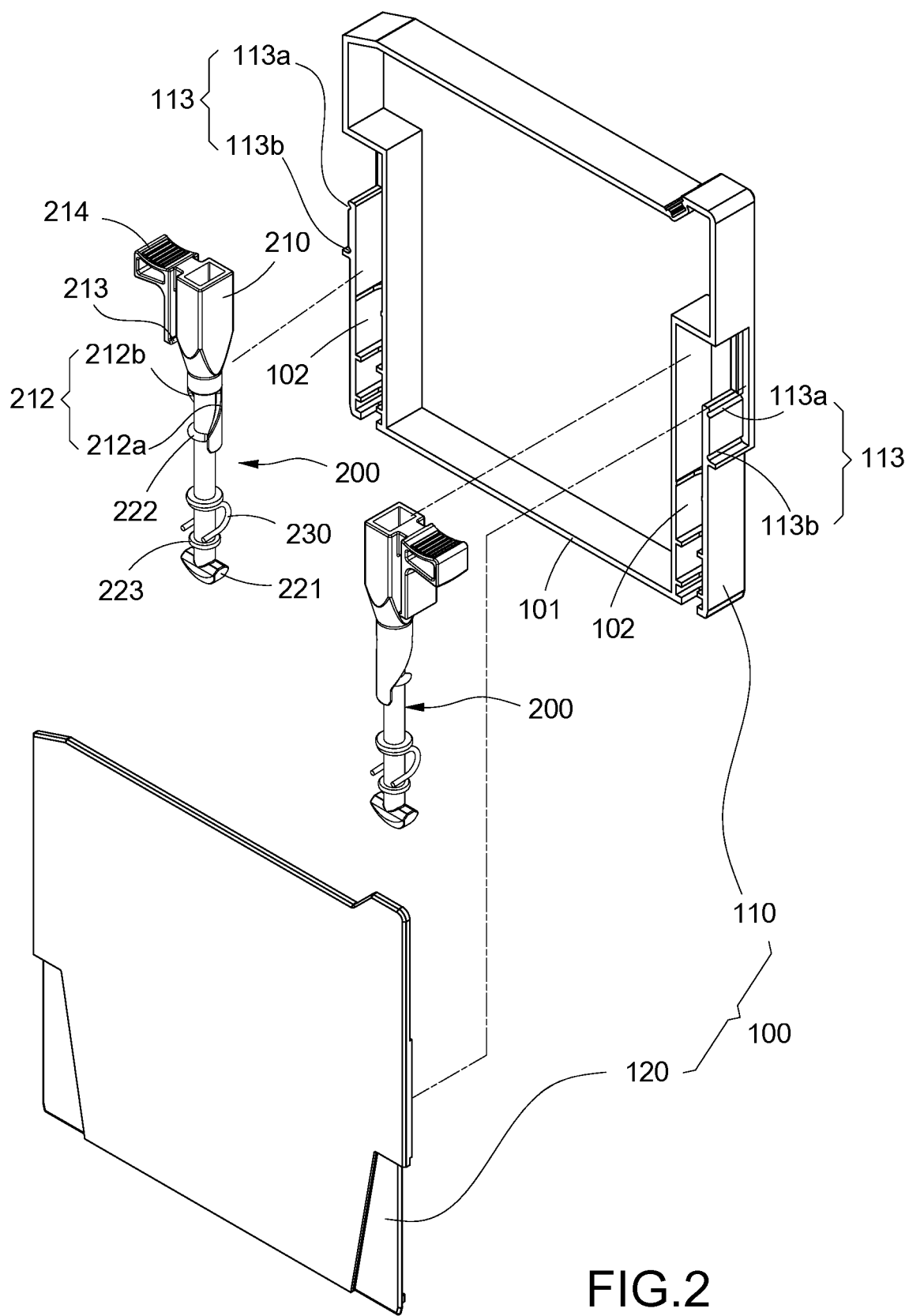
FIG. 2 is an exploded view of the bus device of the terminal block of the disclosure.
Figure 3:
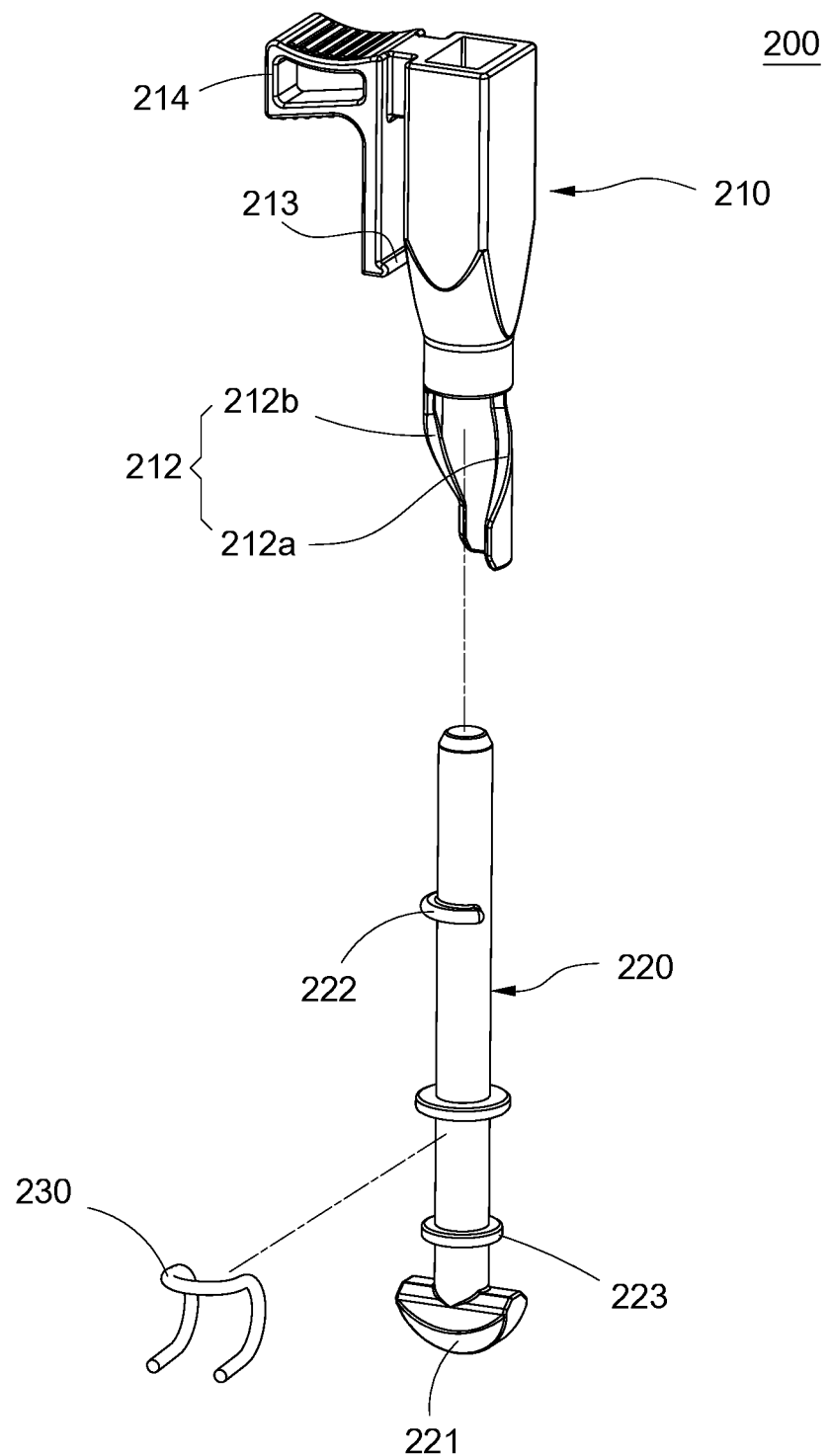
FIG. 3 is an exploded view of the latch assembly of the bus device of the terminal block of the disclosure.

Please refer to FIGS. 1-3. The disclosure provides a bus device of a terminal block, which includes a case 100 and a latch assembly 200 disposed in the case 100. The bus device of the terminal block of the disclosure may further include a socket 300 for being inserted by the case 100. The case 100 and the socket 300 may be fixedly connected by the latch assembly 200.

In the embodiment, the case 100 is a flat rectangular body. The inside of the case 100 is used to receive a circuit board (not shown in the figures) of terminal block. The case 100 has a connecting side 101 and at least one sliding trough 102 defined in the case 100 perpendicular to the connecting side 101. In the embodiment, two ends of the connecting side 101 are separately disposed with a sliding trough 102. The pair of sliding troughs 102 has a symmetrical structure and substantially the same function. The following description mentions only one of sliding troughs 102 as an example, and the disclosure does not limit the number of the sliding troughs 102. In detail, the case 100 includes a box portion 110 and a cover 120 closing the box portion 110. The sliding trough 102 is formed in the box portion 110.

Figure 7:
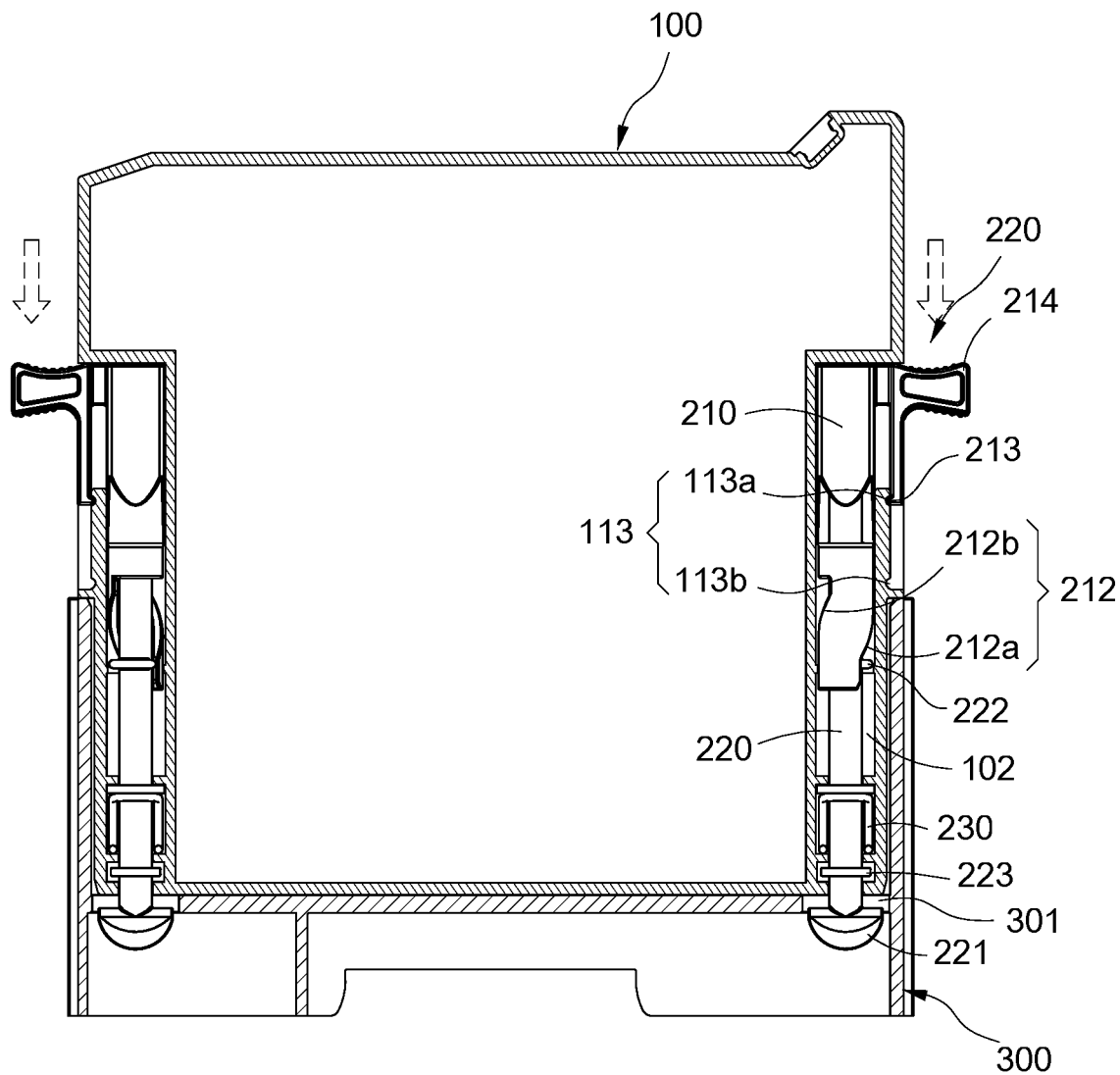
FIG. 7 is a schematic view of the release position of the bus device of the terminal block of the disclosure.
Figure 8:
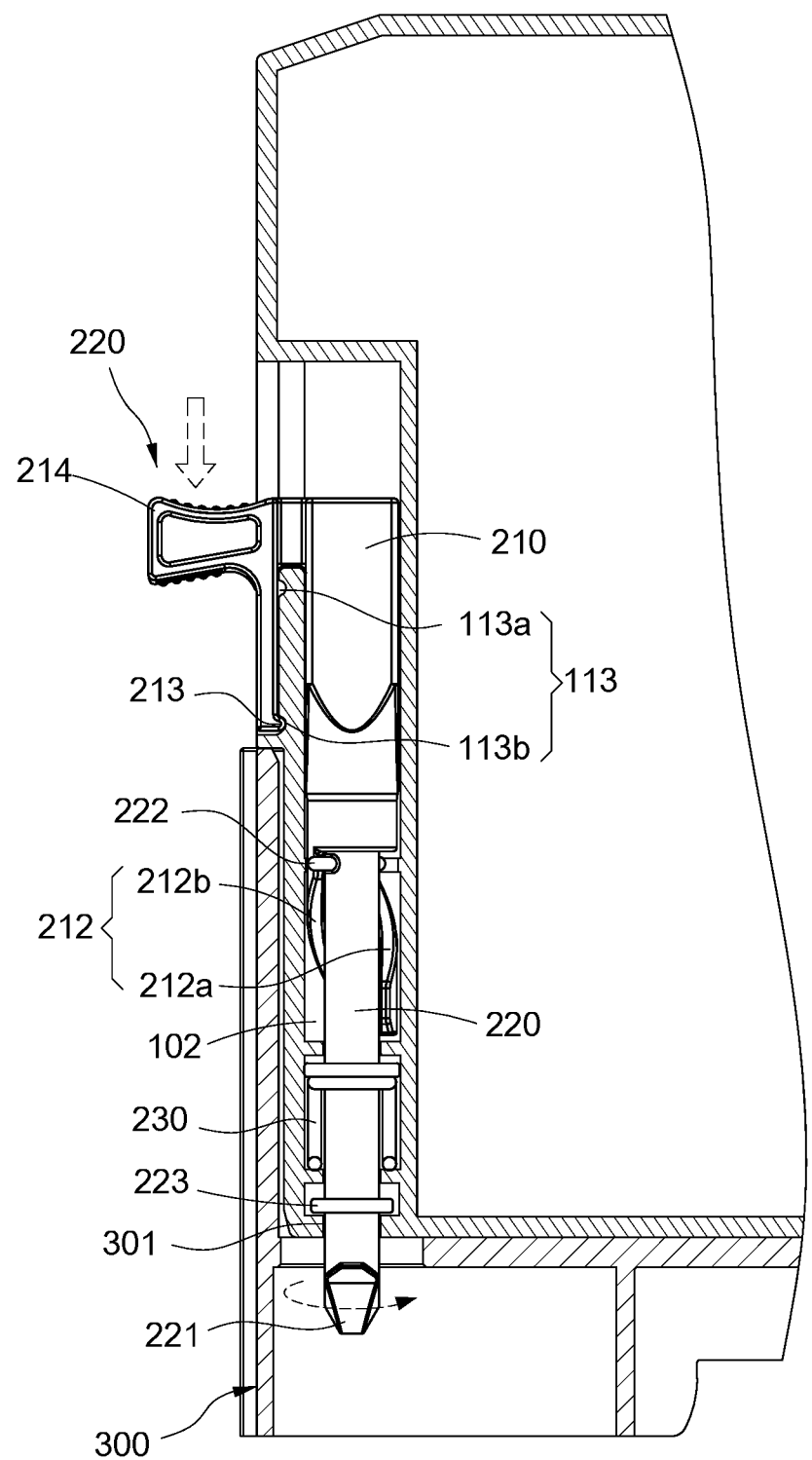
FIGS. 8 and 9 are schematic views of the locking position of the bus device of the terminal block of the disclosure.

Please refer to FIG. 2. The latch assembly 200 is received in the box portion 110. In the embodiment, each sliding trough 102 is arranged with one latch assembly 200. The pair of latch assembly 200 has a symmetrical structure and substantially the same function. The following description mentions only one of sliding troughs 102 as an example, and the disclosure does not limit the number of the latch assembly 200. In detail, the latch assembly 200, as shown in FIG. 3, includes an actuator 210 and a locking peg 220. Please refer to FIGS. 2-5. In the embodiment, the actuator 210 is disposed in the sliding trough 102 and movable along the sliding trough 102 between a release position as shown in FIG. 7 and a locking position as shown in FIG. 8. The actuator 210 has an actuating ramp set 212. The locking peg 220 is axial-rotatably disposed in the case 100 and is arranged corresponding to an end of the sliding trough 102. An end of the locking peg 220 movably passes though the actuator 210, and another end of the locking peg 220 projects from the case 100 and at least one side of the locking peg 220 is provided with an inverted hook 221. A lateral side of the locking peg 220 is protruded with a protrusive key 222 which abuts against the actuating ramp set 212 to make the actuator 210 and the locking peg 220 link together. As a result, when the actuator 210 linearly moves along the sliding trough 102 between the release position and the locking position, the actuator 210 is able to push the actuating ramp set 212 to axially rotate the locking peg 220. In some embodiments, a side wall of the locking peg 220 is protruded with a limiting flange 223. The limiting flange 223 is clamped in the sliding trough 102 with rotational tolerance therebetween to allow the locking peg 220 to axially rotate. The limiting flange 223 may block in the sliding trough 102 to prevent the locking peg 220 from separating from the case 100 when the actuating ramp set 212 push the protrusive key 222 along the longitudinal direction of the locking peg 220.

Figure 4:
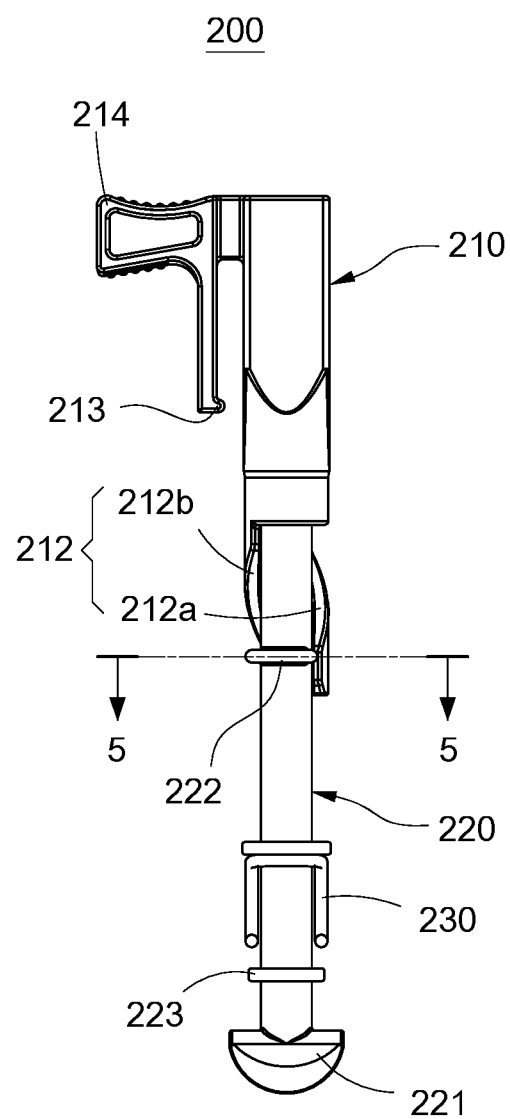
FIG. 4 is an assembled view of the latch assembly of the bus device of the terminal block of the disclosure.
Figure 5:
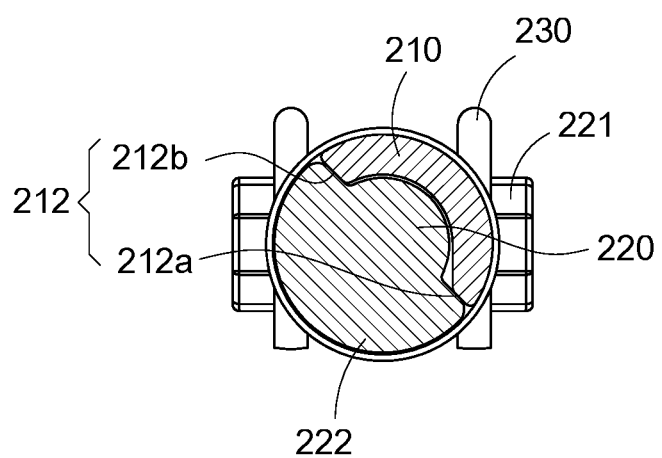
FIG. 5 is a cross-sectional view of the latch assembly along line 5-5 in FIG. 4.

Please refer to FIGS. 3-5. The actuating ramp set 212 includes a release ramp 212a and a locking ramp 212b, which faces to each other. The protrusive key 222 is arranged between the release ramp 212a and the locking ramp 212b. Each of the release ramp 212a and the locking ramp 212b is a spiral ramp. The release ramp 212a is disposed away from the inverted hook 221, the locking ramp 212b is disposed toward the inverted hook 221, and the release ramp 212a and the locking ramp 212b are separately used to abut against two sides of the protrusive key 222.

Figure 6:
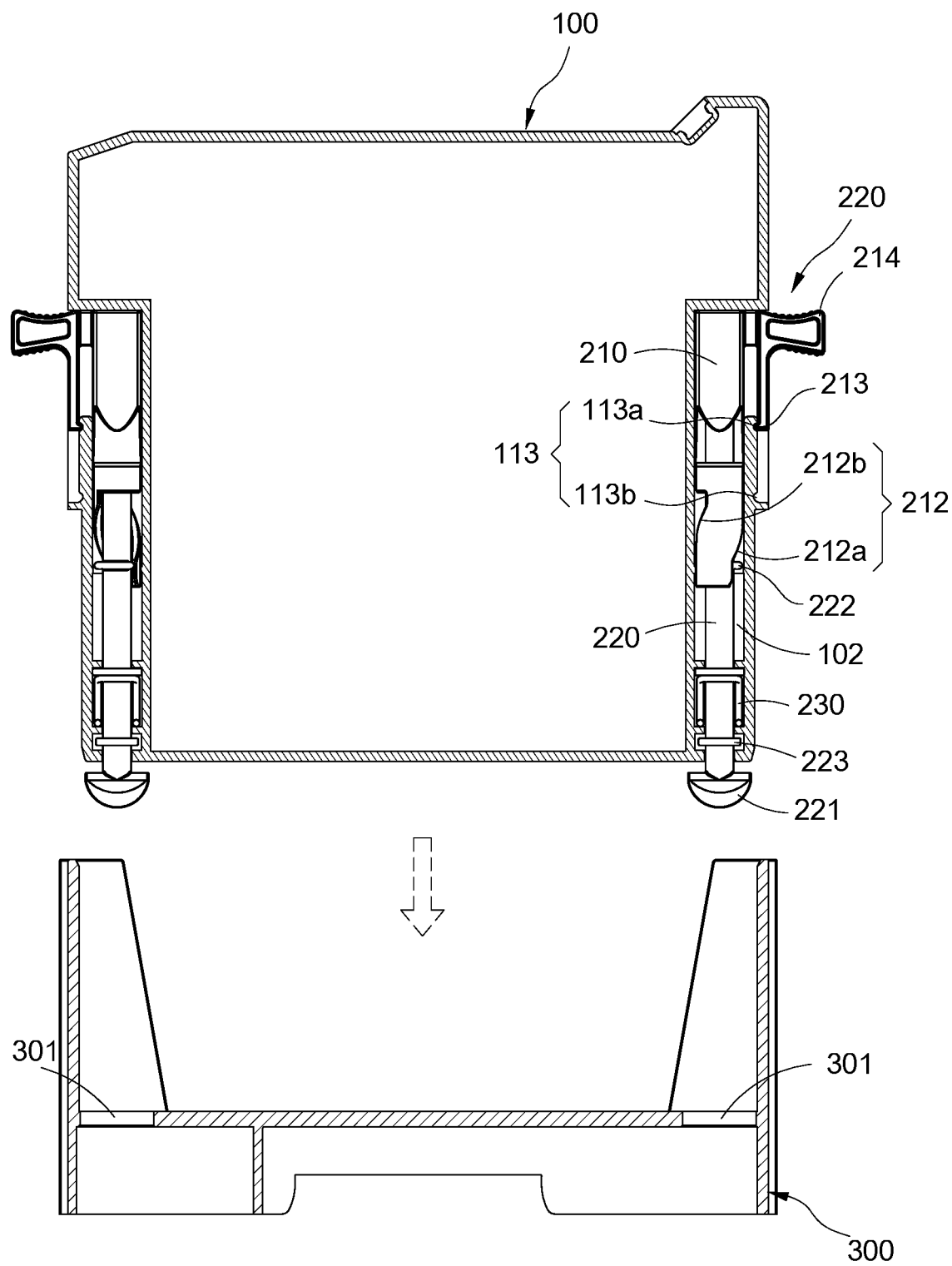
FIG. 6 is a schematic view of inserting connection of the bus device of the terminal block of the disclosure.
Figure 9:
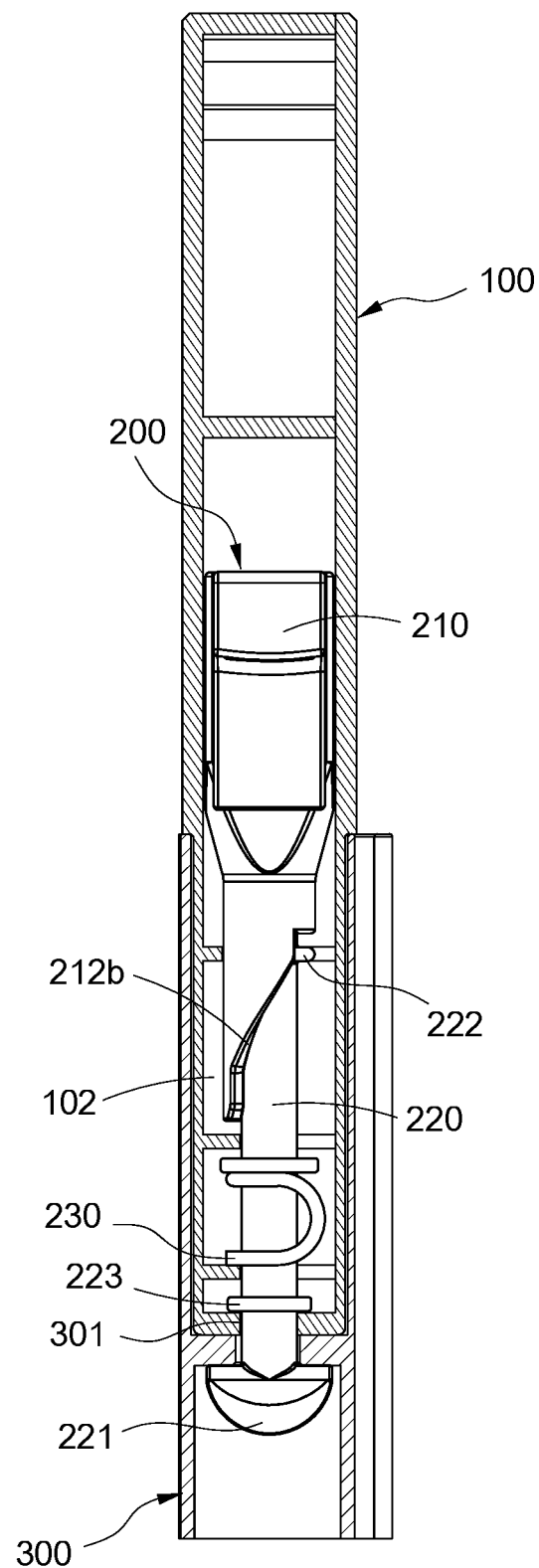

Please refer to FIGS. 1 and 6. The case 100 is connected to the socket 300 with the connecting side 101. The bottom of the socket 300 is formed with a locking hole 301 corresponding to the inverted hook 221. In some embodiments, the bottom of the socket 300 may be provided with an electric connector (not shown in the figures) used for connecting with the circuit board. Please refer to FIGS. 6 and 7. When the actuator 210 is located at the release position, the inverted hook 221 may pass the locking hole 301 to allow plugging or unplugging the case 100. Please refer to FIGS. 8-9. When the case 100 is plugged to the socket 300 and the actuator 210 is located at the locking position, the inverted hook 221 hooks an internal surface of the locking hole 301 to fix the case 100 onto the socket 300.

Please refer to FIGS. 7-8. When a user pushes the actuator 210 from the release position as shown in FIG. 7 to the locking position (along a direction toward the inverted hook 221) as shown in FIG. 8, during the progress of movement, the locking ramp 212b moves along a longitudinal direction of the locking peg 220, and the protrusive key 222 abuts against the locking ramp 212b to relatively move along the locking ramp 212b to axially rotate the locking peg 220 and further rotate the inverted hook 221 to hook the inner surface of the locking hole 301. When a user pushes the actuator 210 from the locking position as shown in FIG. 8 to the release position as shown in FIG. 7 along a direction away from the inverted hook 221, during the progress of movement, the release ramp 212a moves along a longitudinal direction of the locking peg 220, and the protrusive key 222 abuts against the release ramp 212a to relatively move along the release ramp 212a to axially rotates the locking peg 220 and further rotate the inverted hook 221 to separate from the inner surface of the locking hole 301.

Please refer to FIG. 2. In the embodiment, the case 100 is provided with a positioning structure 113 and the actuator 210 has an engaging structure 213. When the actuator 210 moves to the release position as shown in FIG. 7 or the locking position as shown in FIG. 8, the engaging structure 213 is correspondingly engaged with the positioning structure 113 to position the actuator 210 at the release position or the locking position. Please refer to FIGS. 2 and 6-9. The positioning structure 113 includes a pair of engaging slots 113a/113b separately corresponding to the release position and the locking position. The engaging structure 213 is an engaging hook. When the actuator 210 moves to the release position or the locking position, the engaging structure 213 is engaged with one of the engaging slots 113a/113b correspondingly. The positioning structure 113 and the engaging structure 213 of the disclosure are not limited to the above embodiment. In the embodiment, the actuator 210 may have a stem 214 which projects from the case 100 for allowing a user to push the actuator 210.

In the embodiment, the inside of the case 100 may be disposed with an elastic member 230 which separately pushes the inner wall of the case 100 and the locking peg 220 to push the inverted hook 221 toward the case 100. Thus, when the inverted hook 221 hooks the inner surface of the locking hole 301, the case 100 may be tightly fixed in the socket 300 by the cooperation of the elastic member 230 and the inverted hook 221.

In summary, the bus device of the terminal block of the disclosure uses the actuating ramp set 212 to push the protrusive key 222 to convert a linear movement of the actuator 210 into an axial rotation of the locking peg 220 to drive the inverted hook 221 to hook the locking hole 301 to lock the case 100 onto the socket 300 or reversely rotate to release the socket 300. The engaging connection is firm and easy to be released.

While this disclosure has been described by means of specific embodiments, numerous modifications and variations could be made thereto by those skilled in the art without departing from the scope and spirit of this disclosure set forth in the claims.

What is claimed is:

1. A bus device of a terminal block, the bus device comprising:
   a case, comprising a connecting side and a sliding trough; and
   a latch assembly, comprising an actuator and a locking peg, the actuator disposed in the sliding trough and movable along the sliding trough between a release position and a locking position, the actuator comprising an actuating ramp set, the locking peg axial-rotatably disposed in the case and arranged corresponding to an end of the sliding trough, an end of the locking peg projecting from the connecting side and an inverted hook disposed thereon, and the locking peg comprising a protrusive key abutting against the actuating ramp set;

wherein when the actuator moves between the release position and the locking position, the actuating ramp set is configured to push the protrusive key to axially rotate the locking peg.

2. The bus device of claim 1, wherein the actuator comprises a stem projecting from the case.

3. The bus device of claim 1, further comprising: an elastic member disposed in the case and abutting against the case to push the inverted hook toward the case.

4. The bus device of claim 1, wherein the case comprises a positioning structure, the actuator comprises an engaging structure, and the engaging structure is correspondingly engaged with the positioning structure when the actuator moves to the release position or the locking position.

5. The bus device of claim 4, wherein the positioning structure comprises a pair of engaging slots arranged correspondingly to the release position and the locking position respectively, the engaging structure comprises an engaging hook, and the engaging structure is engaged with one of the engaging slots correspondingly when the actuator moves to the release position or the locking position.

6. The bus device of claim 1, wherein the case comprises a box portion and a cover closing the box portion, the sliding trough is disposed in the box portion, and the latch assembly is received in the box portion.

7. The bus device of claim 1, wherein the actuating ramp set comprises a release ramp and a locking ramp facing to each other, and the protrusive key is arranged between the release ramp and the locking ramp.

8. The bus device of claim 7, wherein each of the release ramp and the locking ramp is a spiral ramp.

9. The bus device of claim 7, wherein the release ramp is disposed away from the inverted hook.

10. The bus device of claim 7, wherein the locking ramp is disposed toward the inverted hook.

11. The bus device of claim 1, further comprising: a socket, wherein the socket comprises a locking hole disposed on a bottom thereof, the case is connected to the socket with the connecting side, the inverted hook passes the locking hole when the actuator is located at the release position, and the inverted hook is hooked to an internal surface of the locking hole when the actuator is located at the locking position.

* * * * *